United States Patent [19]
Tung

[11] Patent Number: 6,130,133
[45] Date of Patent: Oct. 10, 2000

[54] FABRICATING METHOD OF HIGH-VOLTAGE DEVICE

[75] Inventor: Ming-Tsung Tung, Hsinchu Hsien, Taiwan

[73] Assignee: United Microelectronics Corp., Hsinchu, Taiwan

[21] Appl. No.: 09/203,779

[22] Filed: Dec. 2, 1998

[51] Int. Cl.[7] ........................ H01L 21/762; H01L 21/336
[52] U.S. Cl. ........................ 438/289; 438/297; 438/443; 438/589
[58] Field of Search ........................ 438/289, 297, 438/443, 589, FOR 193, FOR 204, FOR 205, FOR 229

[56] References Cited

U.S. PATENT DOCUMENTS 4,520,553  6/1985  Kraft .
5,470,770  11/1995  Takahashi et al. .
5,480,823  1/1996  Hsu .
6,010,949  1/2000  Wu .

Primary Examiner—George Fourson
Attorney, Agent, or Firm—Jiawei Huang; J.C. Patents

[57] ABSTRACT

The present invention provides a fabricating method of a high-voltage device. The invention provides $N^{--}$-type doped regions with properly low doping concentration in order to increase breakdown voltage. Field oxide layers are used as masks in a self-aligned ion implantation step to form $N^{-}$-type doped drift regions with a higher doping concentration than the $N^{--}$-type doped regions. A recessed gate is formed so that the channel length is increased and the curvature of the electrical distribution lines on the edge of a drain region nearby a channel is decreased while the device is operated under high voltage.

8 Claims, 3 Drawing Sheets

FABRICATING METHOD OF HIGH-VOLTAGE DEVICE

BACKGROUND OF THE INVENTION

1. Field of the Invention

The present invention relates to a semiconductor fabricating method. More particularly, the present invention relates to a fabricating method and a high-voltage device.

2. Description of the Related Art

A high voltage device is one of the most important devices utilized in highly integrated circuits. Erasable programmable read only memory (EPROM) and flash memory are two of the high-voltage devices most often used in computers and electronic products. In general, operating a device under high voltage can increase the speed of a read or a write operation. Thus, high-voltage devices, which can be operated under high voltage, are required in integrated circuit.

Due to the increasing number of semiconductor devices incorporated in integrated circuits, the size of transistors needs to be decreased. Accordingly, as the channel length of the transistors is decreased, the operating speed is increased. However, there is an increased likelihood of a problem, referred to as a "short channel effect", caused by the reduced channel length. If the voltage level is fixed, according to the equation of electrical field=electrical voltage/channel length, as the channel length is shortened, the strength of the electrical field is increased. Thus, as the strength the of electrical field increases, the energy of the electron increases and electrical breakdown is likely to occur.

In a conventional high-voltage device, occurrence of potential crowding on the edge of the drain region decreases breakdown voltage. In order to increase the breakdown voltage and make the device operable under high voltage, the doping concentration of the drift region must be decreased. Unfortunately, as the doping concentration of the drift region decreases, the current driving performance decreases.

In the conventional high-voltage device, the formation of an isolation layer is used for the purpose of increasing the channel length. In addition, a lightly doped ion implantation is performed on the junction between a depletion region and a source/drain region in order to decrease the hot electron effect. In this way, the breakdown voltage of the source/drain region increases. The high-voltage device is able to work normally under a high electrical voltage.

FIG. 1 is a schematic, cross-sectional view showing a portion of a conventional high-voltage device.

In FIG. 1, two field oxide layers 102 are formed in the P-type silicon substrate 100. A gate oxide layer 112 is formed on the substrate 100 between the two field oxide layers 102. The field oxide layers 102 are used to increase the channel length between an $N^+$-type source region 106 and an $N^{30}$-type drain region 108. An $N^-$-type lightly doped region 116 is to the side of one of the field oxide layers 102. An $N^-$-type lightly doped region 118 is to the side of the other of the field oxide layers 102. A portion of a gate 104 is on the gate oxide layer 112 and the other portion of the gate 104 is on the field oxide layers 102. The $N^-$-type lightly doped regions 116 and 118 are used as drift regions for carriers while the device is operated. As a junction depth of the $N^-$-type lightly doped regions 116 and 118 increases, the effective channel length decreases. Moreover, the $N^-$-type lightly doped regions 116 and 118 are not easily formed in a precise location in the conventional method. There are also P-N junctions (not shown) formed between the $N^-$-type lightly doped region 116 and the substrate 100 or between the $N^-$-type lightly doped region 118 and the substrate 100. The P-N junction regions are called depletion regions. The electrical distribution lines, which are nearby the channel, of the $N^+$-type lightly doped drain region 108 have higher curvature while the device is operated under high voltage. The breakdown voltage thus is decreased. Consequently, the device cannot work normally under high-voltage.

SUMMARY OF THE INVENTION

It is an object of the invention to provide a fabricating method of a high-voltage device that has an increased channel length between the source/drain region.

It is another object of the invention to provide a fabricating method of a high-voltage device that decreases the curvature of the electrical distribution lines which are nearby the channel, of the drain region while the device is operated under high-voltage.

To achieve these and other advantages and in accordance with the purpose of the invention, as embodied and broadly described herein, the invention provides a method of fabricating a high-voltage device that includes the following steps. A first-type substrate is provided. A first doped region and second doped region of a second-type are formed in a portion of the substrate. A first field oxide layer is formed on the first doped region, a second field oxide layer is formed on the second doped region, and a third field oxide layer is formed on the substrate between the first doped region and the second doped region. A third, second-type doped region and a fourth, second-type doped region are formed in the substrate. The third doped region is located between the first field oxide layer and the third field oxide layer. The fourth doped region is located between the second field oxide layer and the third field oxide layer. The third field oxide layer is removed. A gate oxide layer is formed on the substrate between the first field oxide layer and the second field oxide layer. A gate is formed on the gate oxide layer, the first field oxide layer, and the second field oxide layer. A second-type source region is formed in the substrate beside the first field oxide layer and a second-type drain region is formed in the substrate beside of the second field oxide layer.

According to the invention, the first-type dopant is N-type and the second-type dopant is P-type or the first-type dopant is P-type and the second-type dopant is N-type. The doping concentration of the first doped region and the second doped region is higher than the doping concentration of the third doped region and the fourth doped region. The first and second doped regions with lower ion doping concentration are used to increase the breakdown voltage. The third and fourth doped drift regions are formed in order to increase the current driving performance as the breakdown voltage is increased. The first, second, third, and fourth doped regions are used as drift regions. With the different concentrations of the drift regions, the breakdown voltage increases and the current driving performance is not affected.

It is to be understood that both the foregoing general description and the following, detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
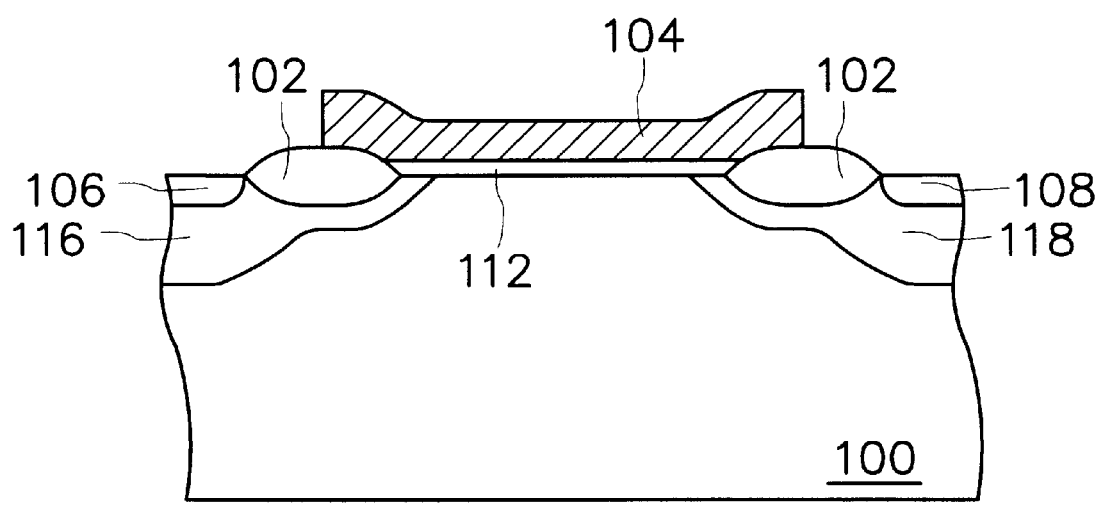
FIG. 1 is a schematic, cross-sectional view showing a portion of a conventional high-voltage device.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing a portion of a high-voltage device according to one preferred embodiment of the invention.

As seen in the following description according to one preferred embodiment of the invention, a P-type silicon substrate 200 is provided to form a high-voltage device. For example, an NMOS device is formed on a P-type silicon substrate 200 or a PMOS can also be formed on an N-well in the P-type silicon substrate 200. The present invention can also be applied to a high-voltage device formed on an N-type silicon substrate. Those skilled in the art will be able to see that the high-voltage device can be completed by the N-type silicon substrate according to the method of the invention.

Figure 2A:
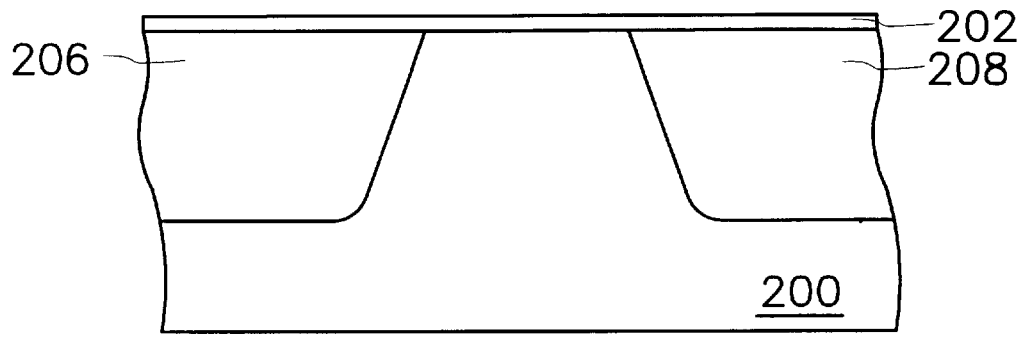
FIGS. 2A through 2F are schematic, cross-sectional views showing a portion of a high-voltage device according to one preferred embodiment of the invention.

In FIG. 2A, a substrate 200 is provided. The substrate 200 can be a P-type silicon substrate 200 or an N-type silicon substrate, for example. In the following steps of the preferred embodiment of the invention, the substrate 200 described below takes the P-type silicon substrate 200. for example. An oxide layer 202 is formed on the substrate 200. A mask layer (not shown) is formed over the substrate 200. An N-type doped ion implantation is performed with a low doping concentration on the substrate 200 exposed by the mask. The mask layer is removed. A thermal step is performed to drive in the implanted ions. $N^{---}$-type doped regions 206 and 208 are formed in the substrate 200. The $N^{---}$-type doped regions 206 and 208 are used as a portion of drift regions for carriers moving between a source region and a drain region (shown in 21F).

In the $N^{---}$-type doped regions 206 and 208 described above, the doping concentration is low enough to prevent the occurrence of potential crowding on the edge of the drain region. This is one of the characteristics of the invention. With low doping concentrations of the $N^{---}$-type doped regions 206 and 208, the breakdown voltage of high-voltage device thus increases.

Figure 2B:
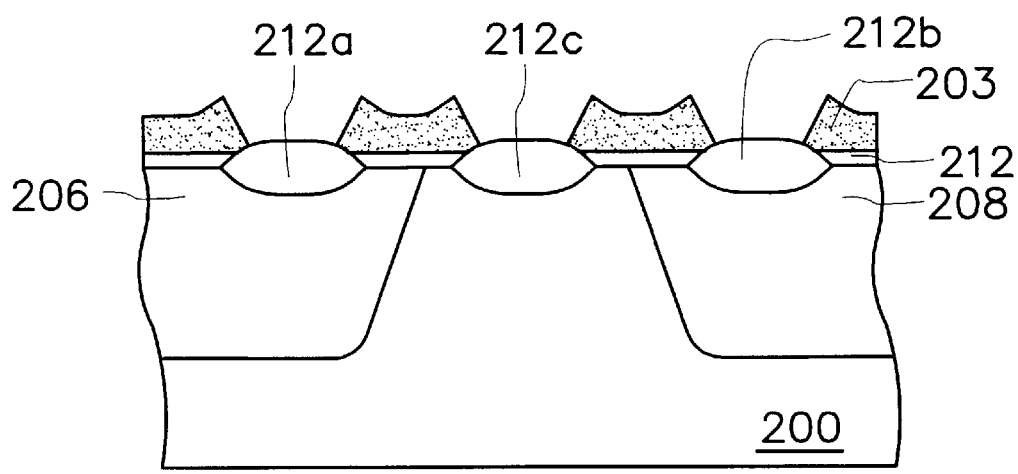

In FIG. 2B, the oxide layer 202 is removed. A pad oxide layer 212 is formed on the substrate 200. A thermal oxidation step is performed on portions of the pad oxide layer 212 to form field oxide layers 212a, 212b, and 212c. The field oxide layer 212a is located on the $N^{---}$-type doped region 206. The field oxide layer 212b is located on the $N^{---}$-type doped region 208. The field oxide layer 212c is located on the substrate 200 between the $N^{---}$-type doped region 206 and the $N^{---}$-type doped region 208. The field oxide layers 212a, 212b, and 212c are used for increasing the channel length between the source region and the drain region. The field oxide layers 212a and 212b further effectively isolate a gate (shown in 2E) from the source/drain region. The field oxide layer 212a, 212b, and 212c can be formed by the following steps, for example. A patterned mask layer 203 is formed on the pad oxide layer 212. The material of the patterned mask layer 203 comprises silicon nitride. A wet oxidation step is performed to oxidize portions of the pad oxide layer 212 exposed by the mask layer 203 to form the gate oxide layers 212a, 212b, and 212c on the substrate 200 exposed by the patterned mask 203.

Figure 2C:
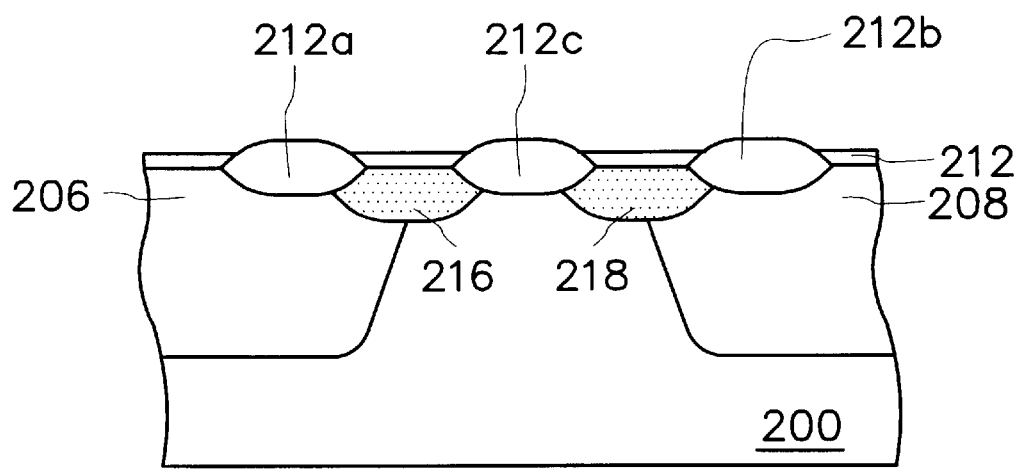

In FIG. 2C, the patterned mask layer 203 is removed. Another mask layer (not shown) is formed over the substrate 200. The mask layer exposes the region between the field oxide layer 212a and the field oxide layer 212c. The mask layer and the field oxide layer 212a, 212b, and 212c are used as masks. A self-aligned ion implantation step is performed. The mask layer is removed. An annealing step is performed. An $N^-$-type doped drift region 216 is formed in the substrate 200 between the field oxide layers 212a and 212b. An $N^-$-type doped drift region 218 is formed in the substrate 200 between the field oxide layers 212b and 212c. The field oxide layers 212a, 212b, and 212c are used to help the mask layer align with the substrate 200 in order to form the $N^-$-type doped drift regions 216 and 218. Thus, the effective channel length can be effectively controlled. The doping concentration in the $N^-$-type doped drift regions 216 and 218 is higher than the doping concentration in the $N^{---}$-type doped regions 206 and 208.

The $N^-$-type doped drift regions 216 and 218 and the $N^{---}$-type doped regions 206 and 208 shown above are used as draft regions for carriers of the source/drain region.

The $N^{---}$-type doped regions 206 and 208 with lower ion doping concentration than $N^-$-type doped drift regions 216 and 218 are used to increase the breakdown voltage. Unfortunately as the ion doping concentration is lightened, the performance of the current driving is decreased. In the invention, the $N^-$-type doped drift regions 216 and 218 are formed in order to increase the current driving performance as the breakdown voltage is increased. The drift regions such as the $N^{---}$-type doped regions 206 and 208 and the $N^-$-type doped drift regions 216 and 218, are characteristics of the invention. With the different concentrations of the drift regions, the breakdown voltage increases and the current driving performance is not affected.

Figure 2D:
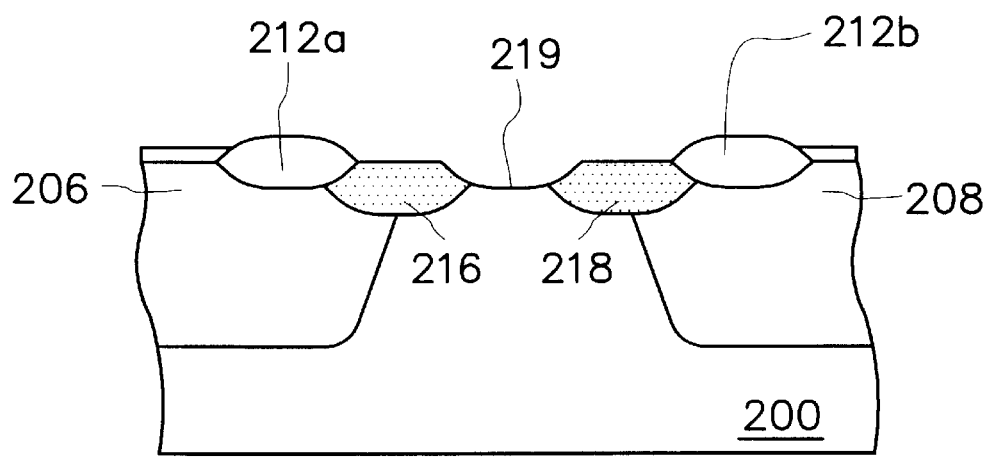

In FIG. 2D, a patterned mask layer (not shown) is formed over the substrate 200. The gate oxide layer 212c a portion of the pad oxide layer 212 between the field oxide layers 212a and 212c, and the other portion of the pad oxide layer 212 between the field oxide layers 212b and 212c are exposed by the patterned mask. The field oxide layer 212c and portions of the pad oxide layer 212 exposed by the patterned mask layer are removed to expose the substrate 200. A recessed surface 219 is obtained on the surface of the substrate 200. The field oxide layer 212c and portions of the pad oxide layer 212 exposed by the patterned mask layer can be removed by wet etching. Tile patterned mask layer is removed.

Figure 2E:
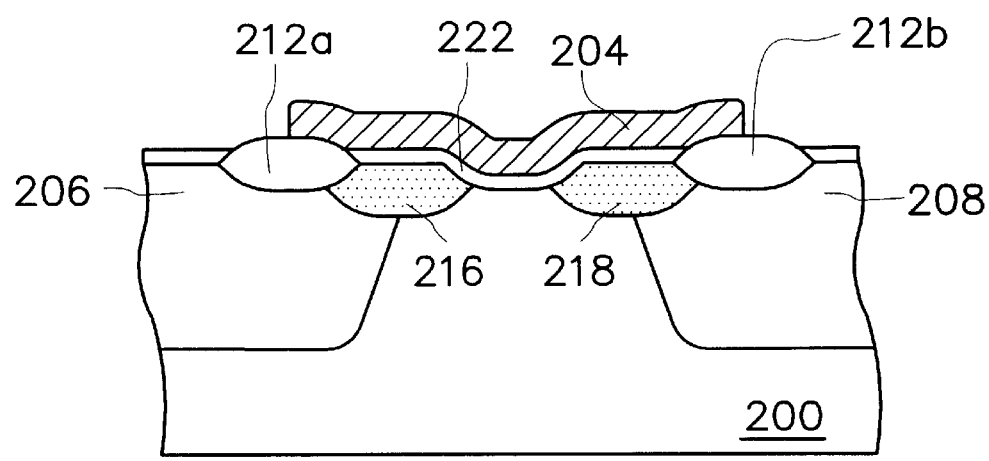

In FIG. 2E. a gate oxide layer 222 is formed over the substrate 200 between the field oxide layer 212a and the field oxide layer 219b. The gate oxide layer 222 can be formed by thermal oxidation, for example. A conductive material layer (not shown) is formed on the gate oxide layer 222. The material of conductive material layer includes doped polysilicon. The conductive material layer is patterned to form a gate 204. The gate 204. which is recessed in shape, is the other characteristic of the invention. The gate 204 provide a recessed channel that decreases the curvature of the electrical distribution lines on the edge of the drain region nearby channel while the device is operated under high-voltage. Thus, the breakdown voltage can be further increased.

Figure 2F:
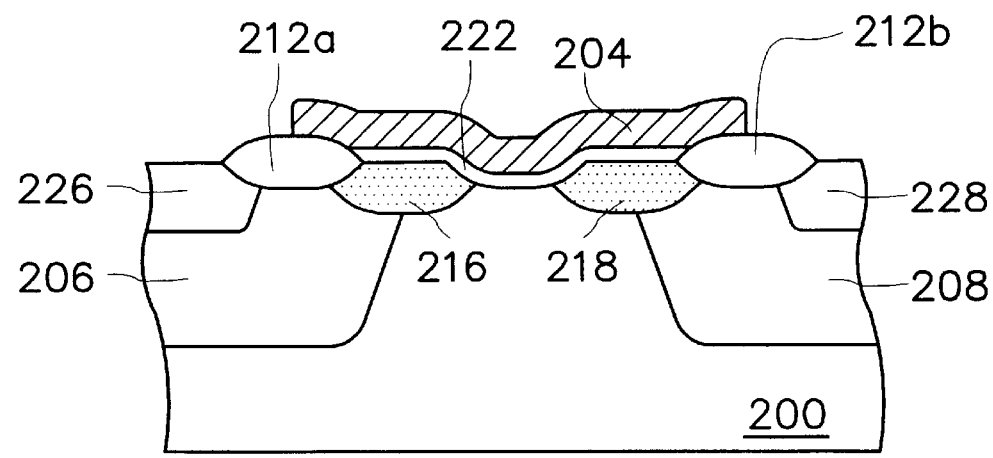

In FIG. 2F, a mask layer (not shown) is formed over the substrate 200 to define a source/drain region. An $N^+$-type ion implantation with high doping concentration is performed on portions of the N⁻⁻⁻-type doped regions 206 and 208 beside the gate 204. An N⁺-type source region 226 is formed in the N⁻⁻⁻-type doped region 206 and to the side of the field oxide layer 212a. An N⁺-type drain region 228 is formed in the N⁻⁻⁻-type doped region 208 and to the side of the field oxide layer 212b. The doping, concentration in the N⁺-type source region 226 and the N⁺-type drain region 228 is higher than the doping concentration in the N⁻-type doped drift regions 216 and 218. The doping concentration in the N⁻-type doped drift regions 216 and 218 is higher than the doping concentration in the N⁻⁻⁻-type doped regions 206 and 208.

In summary, the characteristics of the high-voltage device of the invention include the following:

1. The invention provides the N⁻⁻⁻-type doped regions 206 and 208 with properly low doping concentration in order to prevent the occurrence of potential crowding on the edge of the drain region nearby channel. With low doping concentrations of the N⁻⁻⁻-type doped regions 206 and 208, the breakdown voltage of the high-voltage device increases. In the invention, the N⁻-type doped drift regions 216 and 218 are formed in order to increase the current driving performance as the breakdown voltage is increased by the N⁻⁻⁻type doped regions 206 and 208. The drift regions, such as the N⁻⁻⁻-type doped regions 206 and 208 and the N⁻⁻⁻-type doped drift regions 216 and 218, are the characteristics of the invention. With the different concentrations of the drift regions, the breakdown voltage increases and the current driving performance is not affected.

2. The field oxide layers 212a, 212b, and 212c are used as masks in the self-aligned ion implantation step. Thus, the effective channel length can be effectively controlled.

3. In the invention, the recessed surface 219 and the recessed gate 204 are formed. The recessed channel thus is obtained so that the curvature of the electrical distribution lines on the edge of the drain region nearby channel is decreased while the device is operated under high-voltage. Thus, the breakdown voltage can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of high-voltage devices, comprising the steps of:

providing a first-type substrate;

forming a first, second-type doped region and second, second-type doped region in portions of the first-type substrate;

forming a first field oxide layer on the first doped region, a second field oxide layer on the second doped region, and a third field oxide layer on the substrate between the first, second-type doped region and the second, second-type doped region;

forming a third, second-type doped region and a fourth, second-type doped region in the substrate, wherein the third doped region is between the first field oxide layer and the third field oxide layer, and the fourth doped region is between the second field oxide layer and the third field oxide layer;

removing the third field oxide layer;

forming a gate oxide layer on the substrate between the first field oxide layer and the second field oxide layer;

forming a (gate on the gate oxide layer the first field oxide layer, and the second field oxide layer; and forming a second-type source region in the first-type substrate to the side of the first field oxide layer and a second-type drain region in the first-type substrate to the side of the second field oxide layer.

2. The method of claim 1, wherein the first-type is N-type and the second-type is P-type.

3. The method of claim 1, wherein the first-type is P-type and the second-type is N-type.

4. The method of claim 1, wherein the doping concentration of the first doped region and the second doped region is higher than the doping concentration of the third doped region and the fourth doped region.

5. A fabricating method of high-voltage devices, comprising the steps of:

providing a second-type substrate having a first-type well therein;

forming a first, second-type doped region and a second, second-type doped region in portions of the first-type well;

forming a first field oxide layer on the first, second-type doped region, a second field oxide layer on the second, second-type doped region, and a third field oxide layer on the first-type well between the first doped second-type region and the second doped region;

forming a third second-type doped region and a fourth second-type doped region in the first-type well, wherein the third second-type doped region is between the first field oxide layer and the third field oxide layer, and the fourth second-type doped region is between the second field oxide layer and the third field oxide layer;

removing the third field oxide layer;

forming a gate oxide layer on the first-type well between the first field oxide layer and the second field oxide layer;

forming a gate on the gate oxide layer, the first field oxide layer, and the second field oxide layer; and forming a second-type source region in the first-type well to the side of the first field oxide layer and a second-type drain region in the first-type well to the side of the second field oxide layer.

6. The method of claim 5, wherein the first-type dopant is N-type and the second-type dopant is P-type.

7. The method of claim 5, wherein the first-type dopant is P-type and the second-type dopant is N-type.

8. The method of claim 5, wherein the doping concentration of first doped region and the second doped region is higher than the doping concentration of the third doped region and the fourth doped region.

* * * * *